(12) United States Patent
Perner (10) Patent No.: US 6,865,104 B2
(45) Date of Patent: Mar. 8, 2005

(54) MAGNETORESISTIVE RANDOM ACCESS MEMORY (MRAM) WITH ON-CHIP AUTOMATIC DETERMINATION OF OPTIMIZED WRITE CURRENT METHOD AND APPARATUS

(75) Inventor: Frederick A. Perner, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/459,635

(22) Filed: Jun. 10, 2003

(65) Prior Publication Data

US 2003/0210596 A1 Nov. 13, 2003

Related U.S. Application Data

(62) Division of application No. 10/044,724, filed on Jan. 10, 2002, now Pat. No. 6,606,262.

(51) Int. Cl.$^7$ .............................................. G11C 11/00
(52) U.S. Cl. ........................ 365/158; 365/171; 365/173
(58) Field of Search ................................ 365/158, 171, 365/173, 209

(56) References Cited

U.S. PATENT DOCUMENTS 6,603,677 B2 * 8/2003 Redon et al. ................ 365/158
6,608,790 B2 * 8/2003 Tran et al. ................... 365/211

\* cited by examiner

*Primary Examiner*—Huan Hoang (57) ABSTRACT

A magnetoresistive random access memory (MRAM) cell array device, which may be embodied in a resistive cross point memory (RXPtM) device, includes a chip (i.e., substrate) on which is formed an array of MRAM cells. Preferably, formed on this same chip is a controller effecting a setup algorithm for determining a most preferable write current (or currents) to be used in writing binary data bits into memory cells of the array while preserving data previously written into other memory cells of the array.

10 Claims, 6 Drawing Sheets

MAGNETORESISTIVE RANDOM ACCESS MEMORY (MRAM) WITH ON-CHIP AUTOMATIC DETERMINATION OF OPTIMIZED WRITE CURRENT METHOD AND APPARATUS

This is a divisional of application Ser. No. 10/044,724 filed on Jan. 10, 2002, now U.S. Pat. No. 6,606,262, which is hereby incorporated by reference herein.

BACKGROUND OF THE INVENTION

1. Field of the Invention

The present invention relates to devices for data storage and retrieval. Particularly, this invention relates to a magnetoresistive random access memory device (MRAM), which may be implemented using a resistive cross point memory (RXPtM) cell array (although the invention is not so limited), and to method and apparatus for automatically determining an optimized level (or levels) of writing current to record a binary data bit in a memory cell of such an array. Moreover, a memory device embodying the invention may also be of a type other than resistive cross point MRAM memory, such as of an MRAM memory with series diode or transistor switch elements.

The current which is used to record a binary data bit (i.e., a "1" or "0") in a memory cell of a memory device embodying the invention is termed a "write current," or "writing current," and this invention provides a method and apparatus for optimizing such writing current. Further, this invention relates to such a method and apparatus in which the memory cell array, and a write controller most preferably are both defined on the same chip (i.e., on the same substrate). More particularly, this invention relates to a method and apparatus for determining a write current level which is optimized not only with respect to writing data into a selected memory cell in which it is desired to record a binary data bit, but also with respect to maintaining data integrity in other non-selected memory cells in which other data may be written, and which other data is not to be compromised even though the non-selected memory cells are exposed to a magnetic effect from the writing current.

2. Related Technology

Magnetoresistive Random Access Memory ("MRAM") is a non-volatile memory that is being considered for long term data storage. A typical MRAM device includes an array of memory cells. In one embodiment of MRAM, word lines extend along rows of the memory cells, and bit lines extend along columns of the memory cells. Thus, the memory cells are each located at a cross point of a word line and a bit line, and each memory cell includes two masses of magnetic material. One of the masses is magnetically fixed and the other is magnetically variable. A memory cell stores a bit of information as the relative orientation of the magnetizations of the fixed and variable magnetic materials. In other words, the magnetization of each memory cell at any given time assumes one of two stable orientations. These two stable orientations, referred to as "parallel" and "anti-parallel" magnetic orientation, represent logic values of "0" and "1," for example. The resistance of a memory cell varies dependent upon whether it stores a "0" or a "1" value. That is, the resistance of a memory cell is a first value "R" if the orientation of the magnetizations of the fixed magnetic material and of the variable magnetic material is parallel, and the resistance of the memory cell is increased to a second value R+ΔR if the orientation of the magnetizations is anti-parallel. The relative orientation of the magnetizations of a selected memory cell (and, therefore, the logic state of the memory cell) may be read by sensing the resistance value of the selected memory cell. Thus, this embodiment of an MRAM memory device can be referred to as a Resistive Cross Point Memory (RXPtM) Cell Array, and this name has reference to the fact that the memory cells change in apparent resistance value dependent upon whether they store a binary one, or a binary zero.

Performing read and write operations in MRAM devices could be orders of magnitude faster than performing read and write operations in conventional long term storage devices, such as hard drives, for example. In addition, the MRAM devices could be more compact and could consume less power than hard drives and other such conventional long term data storage devices.

However, writing data into MRAM cells requires that a writing current be applied to both the word line and to the bit line that cross at a selected memory cell. Thus, it is clear that one of the particular word line and bit line crosses other non-selected memory cells in which other data may already be stored. The write current used to effect writing of data into the selected memory cell must be high enough to reliably effect the orientation of the magnetic field in that selected memory cell (referred to as a "write current threshold"), but not so high as to effect the magnet field orientation at any non-selected memory cell (referred to as the "half select threshold"). The non-selected memory cells are referred to also as half-selected memory cells because these memory cells are exposed to only one of the word and bit lines to which the write currents are applied, and thus are exposed to about one-half of the write current.

Further, it appears that the write current necessary to write a data bit into MRAM cells differs dependent upon whether the data bit to be written is a binary "1" or a binary "0." In other words, the direction of orientation of the magnetic field in the variable layer of magnetic material may be more difficult to change from a first orientation to the second orientation than it is to change from the second orientation to the first orientation. This phenomenon has an influence upon the write threshold and the half select threshold, because a bit line write current optimized to reliably write a data "1" may not be optimum to write a data "0." Thus, these memory cells which are ready to change magnetic field orientation in the easy direction are particularly susceptible to a loss of the stored data values.

While it appears that the write current threshold and half select threshold of MRAM cell arrays are substantially constant throughout the life of each array, the current levels for each particular array appears to be dependent upon a number of design variables, fabrication variables, geometry variables, and process variables. Thus, each particular MRAM cell array needs to have its write current and half select currents determined. Further, these current values may change in view of some environmental factors for each particular MRAM cell array, such as changes in operating temperature and/or changes in the operating voltage of the memory cell array.

Thus, there is a need to reliably write data to memory cells in an array of MRAM cells (i.e., in RXPtM devices, for example) while safely preserving the integrity of data in other cells of the array of memory cells.

Currently, it is known to calibrate write current power supplies for MRAM cell arrays using a laboratory procedure. That is, a test engineer works with a particular array of memory cells over a period of time to determine the appropriate level of write current to apply to the word and bit lines. This laboratory procedure is not appropriate or practicable for serial production of MRAM cell arrays at a commercially viable cost.

Thus, there is a need to provide a method which may be automated so as to determine optimum writing current levels for a MRAM cell array.

SUMMARY OF THE INVENTION

These needs are met by the present invention. According to one aspect of the present invention, a first pair of write current power supplies (i.e., a "row" power supply and a "column" power supply) are calibrated for a particular MRAM cell array by successively applying an incrementally increased write current to selected memory cells of the array, and then testing for the integrity of the written data after every application of the write current. When no writing errors are detected, it is noted that a current level has been reached that will reliably write data to the particular memory cell array. Thus, it is known that current levels at or above this threshold current level will reliably write data to the particular memory cell array.

However, the question remains as to how high the write current may be without also being above the half select threshold. Thus, to determine the half select threshold for the particular memory cell array, one of the power supplies is used to apply only one of the write currents (i.e., a half current) to only one of the word or bit lines, and this half current is again incrementally increased, and the data stored in particular memory cells crossed by the word or bit lines is tested for data invalidities after each incremental increase of the writing half current. When a half current level is reached at which data invalidities begin to occur, the half current level is noted. A preferred write current level is an average of the current level for reliable writing and the current level at which data invalidities result from the half select current level Further, a method of determining the appropriate write current level for an array of similar MRAM memory cells includes utilization of a particular algorithm for selecting the write current for rows of the memory cells, for columns of the memory cells when writing a digital one, and for columns of the memory cells when writing a digital zero.

Other aspects and advantages of the present invention will become apparent from the following detailed description, taken in conjunction with the accompanying drawings, illustrating by way of example the principles of the present invention.

DETAILED DESCRIPTION OF AN EXEMPLARY PREFERRED EMBODIMENT OF THE INVENTION

The present invention is most preferably embodied in an MRAM memory device, which includes a memory cell array, current drivers for writing data to the cells of the memory cell array, a read or sense amplifier array, an address generator, an array of registers for recording writing currents used for rows, columns (when writing a digital one), for columns (when writing a digital zero), each register being associated with a digital to analog converter (DAC), a controller, all on a single chip or substrate.

That is, the elements of the memory cell array, and of the other components or functional elements enumerated above are most preferably all formed on the same chip. However, the invention is not so limited, and the components and circuit elements needed to carry out the inventive method may be found or situated on more than one chip, or as discrete circuit elements on circuit boards, for example.

Figure 1:
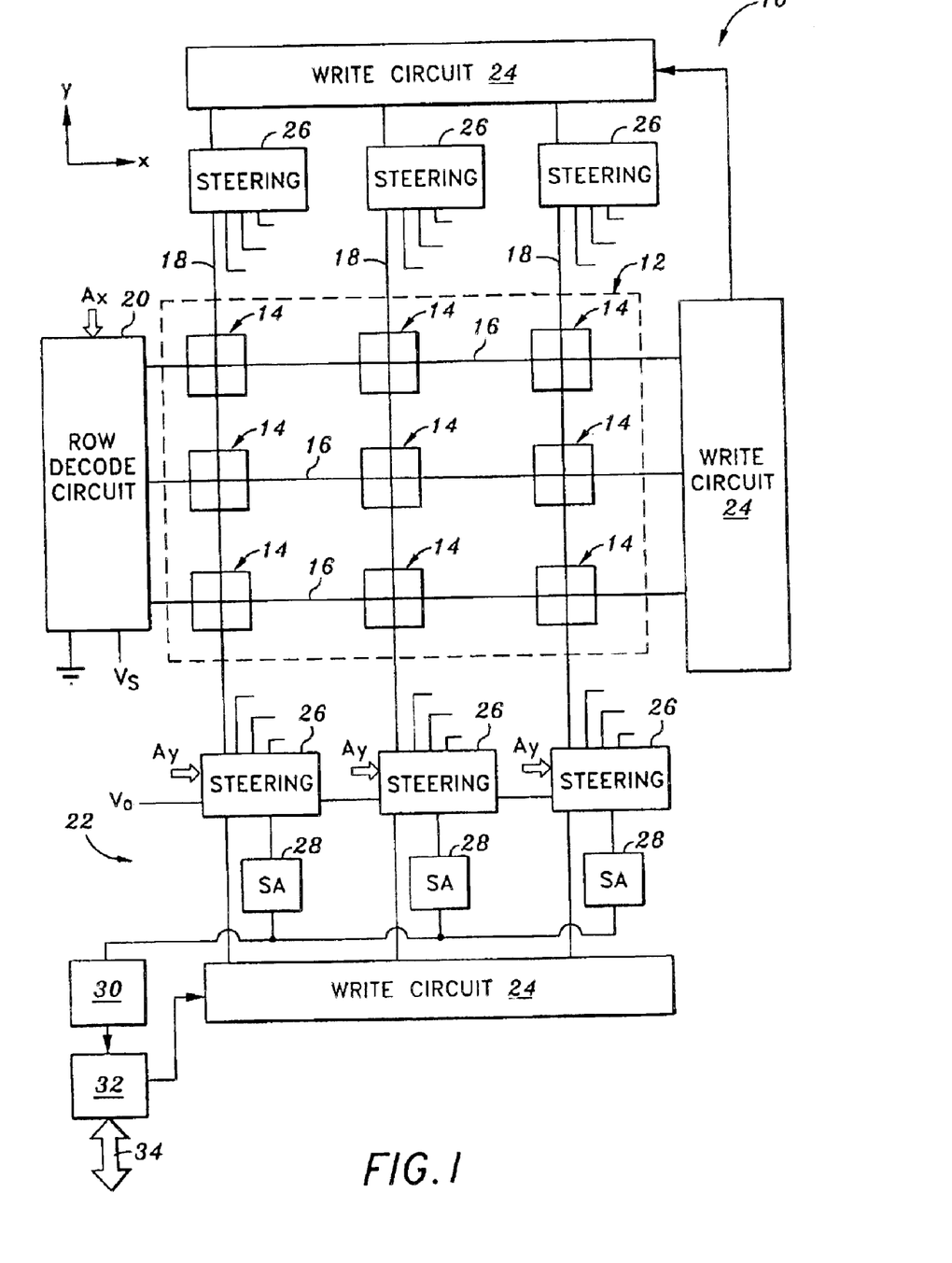
FIG. 1 is a very generalized schematic illustration of an MRAM memory cell array according to the present invention.

Reference is now made to FIG. 1, which schematically illustrates an MRAM device 10 including an array 12 of memory cells 14. The embodiment of MRAM device seen in the present disclosure may be referred to as a Resistive Cross Point Memory (RXPtM) device, but it is to be clearly understood that the invention is not limited to implementation in this or any particular single form of MRAM device. That is, the present invention may find implementation in MRAM memories with series diode or transistor switch elements. Returning to consideration of FIG. 1, it is seen that the memory cells 14 are preferably arranged in rows and columns to form the array 12, with the rows extending in an x-direction and the columns extending in a y-direction. Only a relatively small number of memory cells 12 are shown in FIG. 1 in order to simplify the description of the invention. In practice, arrays of memory cells of any number may be used.

Individual conductive traces functioning as word lines 16 extend in the x-direction in a plane on one side of the memory cells of the array 10. Other individual conductive traces functioning as bit lines 18 extend in the y-direction in a plane on an opposite side of the cells of the memory cell array 10. That is, there is generally one word line 16 for each row of the array 10 and one bit line 18 for each column of the array 10. Each memory cell 14 is located at a cross point (i.e., in the plan view of FIG. 1, for example) of a corresponding word line 16 and bit line 18, hence the name "resistive cross point memory" cell array, or RXPtM.

The memory cells 14 are not limited to any particular type of device. For example the memory cells 14 may be fabricated to utilize spin dependent tunneling ("SDT") junction devices. This type of junction device is also referred to as a magnetic tunneling junction (MTJ) memory device. That is, the resistance value of each the memory cells 14 between the crossing conductive traces 16 and 18 at that junction is dependent upon the value (i.e., 1 or 0) of a data bit stored in the particular cell.

Further considering FIG. 1, the RXPtM cell array 10 also includes a row decode circuit 20. During read operations, the row decode circuit 20 may apply either a constant supply voltage Vs or a ground potential to selected ones of the word lines 16. The constant supply voltage Vs may be provided by an external circuit.

The RXPtM cell array 10 further includes a read circuit 22 for sensing the resistance of selected memory cells 14 during read operations, and a write circuit (generally referenced herein with the numeral 24) for orienting the magnetization of selected memory cells 14 during write operations. The write circuit 24 is more particularly explained below in order to simplify the explanation of FIG. 1.

The read circuit 22 includes a plurality of steering circuits 26 and sense amplifiers 28. Multiple bit lines 18 are connected to each steering circuit 26. Each steering circuit 26 includes a set of switches that connect each bit line 18 during a read operation to either a source of operating potential (Vo) or to a sense amplifier 28. An output of the sense amplifier 28 is supplied to a data register 30, which, in turn, is coupled via an I/O controller circuit 32 to an output (indicated by arrowed numeral 34) of the MRAM device 10. During data reading and writing operations, the I/O controller 32 controls the entire MRAM device 10, and the outputs 34 may be common to one another.

Figure 2A:
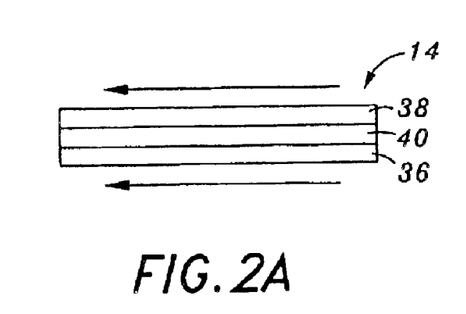
FIGS. 2a and 2b are illustrations of parallel and antiparallel magnetization orientations within a typical MRAM memory cell.
Figure 2B:
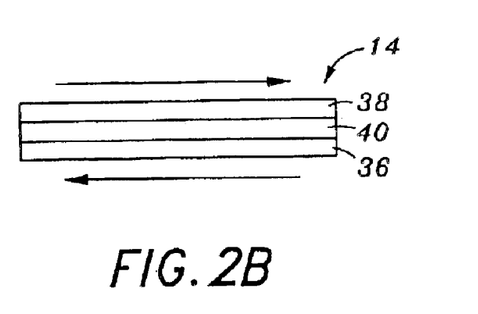

Referring now to FIGS. 2a and 2b, a typical SDT junction (MTJ) memory cell 14 includes a magnetic layer 36 of "pinned" or fixed magnetic orientation. The layer 36 has a magnetization that is oriented in the plane of the pinned layer 36, and this magnetization is constant or fixed in a selected direction in this plane so as not to change orientation in the presence of an applied magnetic field having a magnitude within a range of interest. The SDT junction device 14 also includes a "free," or variable magnetic layer 38 having an orientation of magnetization that is not pinned and which is selectively variable. That is, the direction of the magnetization of the layer 38 can be selectively oriented in either of two directions both lying in the plane of the layer 38. In other words, the orientation of the magnetization of layer 38 may selectively be along an axis (the "easy" axis as seen in FIG. 2a) lying in the plane of the free layer 38. If the magnetization of the free and pinned layers 36 and 38 are in the same direction, the orientation is said to be "parallel" (again, as is indicated by the arrows in FIG. 2a). If the magnetization of the free and pinned 36 and 38 layers are not substantially parallel (i.e., are in substantially perpendicular or opposite directions) (still viewing FIG. 2b), then the orientation is said to be "anti-parallel." The magnetization in the free layer 38 may be selectively oriented by applying write currents in selected directions to word and bit lines 16 and 18 that cross the memory cell 14.

The free and pinned layers 34 and 36 are separated by an insulating tunnel barrier 40. The insulating tunnel barrier 40 allows quantum mechanical tunneling to occur between the free and pinned layers 36 and 38. This tunneling phenomenon is electron spin dependent, making the resistance of the SDT junction device 14 a function of the relative orientations of the magnetizations of the free and pinned magnetic layers 36 and 38. Again, the resistance of a SDT junction device 14 will have a first value R if the orientation of the magnetizations of the free and pinned layers 36 and 38 are parallel, and will have a second value R+ΔR if the orientations of the magnetizations is anti-parallel.

Figure 3:
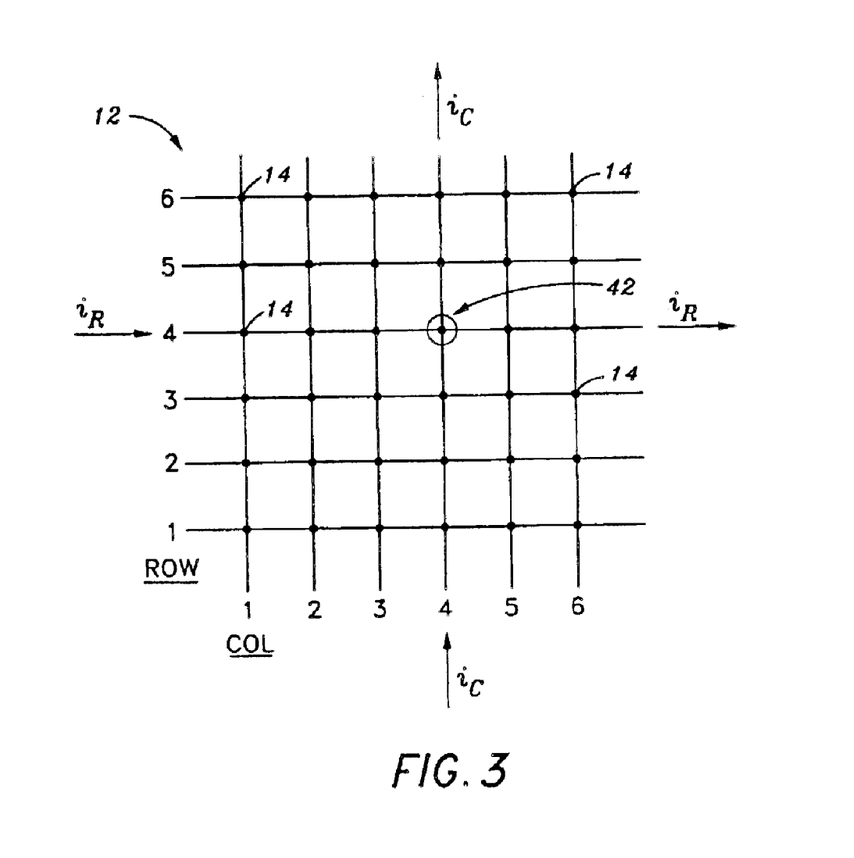
FIG. 3 is a very diagrammatic illustration of an exemplary MRAM memory cell array and the conductive traces of this array in which a selected memory cell is being written to, and other memory cells are exposed to half select writing currents carried on the conductive traces.

Referring to FIG. 3 a selected memory cell 42 is shown undergoing a write operation in an exemplary 6×6 array of memory cells, recalling that the invention is not so limited. The selected memory cell 42 is crossed by row conductor #4, and by column conductor #4, so that when row and column write currents are applied to these conductors (indicated by the characters "I sub-R" and "I sub-C" on FIG. 3) the magnetic field (hereinafter represented by symbol "H") caused by the current flows cooperatively changes the direction of magnetization of the free layer 38 of the cell 42. However, it is seen that each memory cell along row conductor #4, and each memory cell along column conductor #4, is exposed to the current level (i.e., magnetic field) of that conductor during a write operation. Thus, each memory cell along conductor #4 (in each of the row and column directions in this example) is a "half-selected" memory cell. Importantly, the half selected cells can have binary data bits written into them, and that written data must not be altered by a writing operation carried on for cell 42. Thus, the writing currents for cell 42 must have a margin with respect to the half select current level which will alter any of the data bits written into any of the cells crossed by the conductors intersecting (in plan view) at cell 42.

Figure 4:
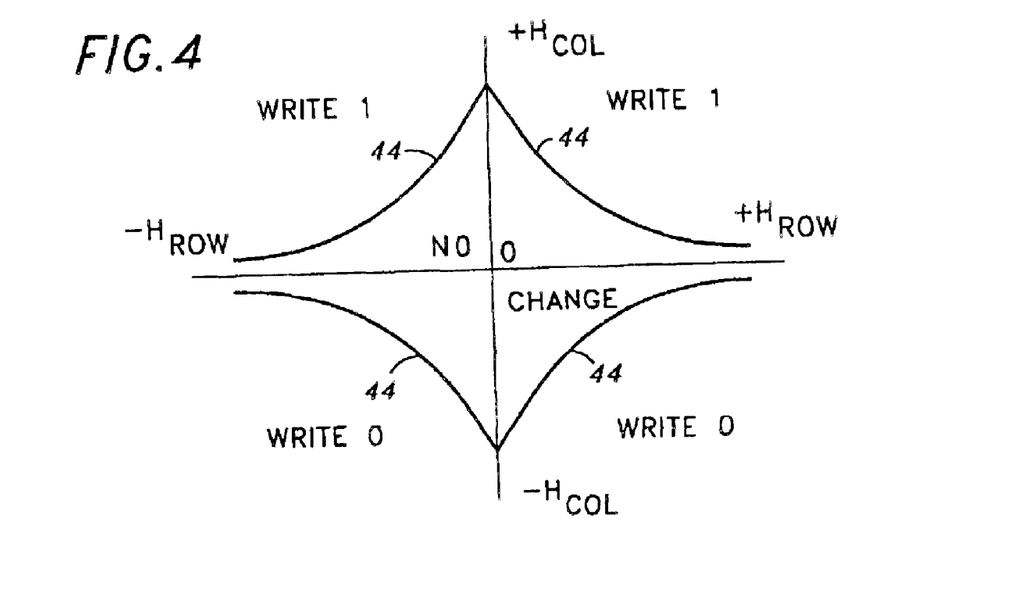
FIG. 4 is a graphical representation of an exemplary relationship of applied current versus writing effectiveness for a typical MRAM memory cell.
Figure 5:
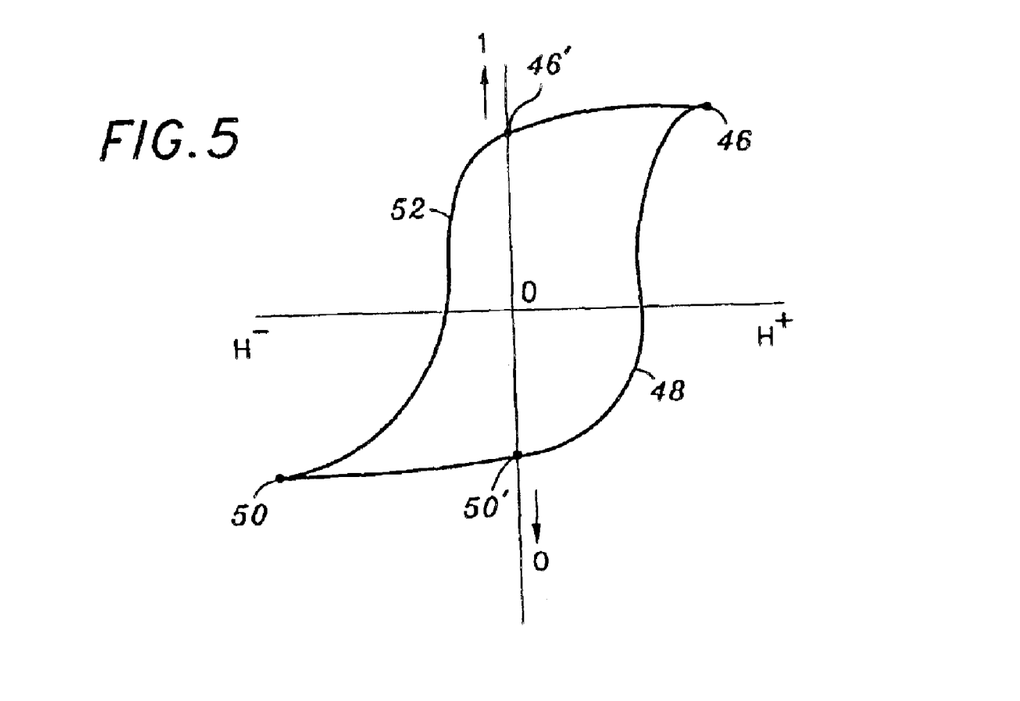
FIG. 5 is an exemplary hysteresis curve of a typical MRAM memory cell, and shows the curve of the MRAM resistance to change of magnetic orientation (y-axis) versus the magnetic field applied to the variable layer of an MRAM memory cell.

Referring now to FIGS. 4 and 5 in conjunction to one another, and considering first FIG. 4, it is seen that for an exemplary memory cell (i.e., memory cell 42 indicated in FIG. 3, for example), a relationship exists which may be illustrated graphically, between the applied magnetic fields and the magnetic orientation of the magnetized free layer 38 of that memory cell. Near the axes of this graphical illustration, there exists a region labeled "no change" in which the magnetic field resulting from the vector sum of the magnetic fields induced by the row and column currents (i.e., by "I sub-R", and "I sub-C", recalling FIG. 3) is not sufficient to determine the direction of the magnetization of the free layer 38. At a distance spaced from these axes, are regions in which the applied magnetic fields are sufficient to effect this direction of magnetization of the free layer 38. That is, outside of the "no change" region, are the regions where the effective magnetic fields will "write" a binary data value into the selected memory cell. The boundary between the "no change" region and the writing regions is indicated on FIG. 4 by the four lines 44. As can be seen from an inspection of FIG. 4, for column currents greater (or less) than a half select threshold, the effective field either will (or will not) change the direction of the free magnetic layer, even though no row current is applied. Again, the effect of the vector sum of the magnetic fields from applied row and column currents is represented by lines 44 with respect to the transition from the "no change" region to the "write" regions. It will be noted that for purposes of simplicity FIG. 4 illustrates a symmetrical writing relationship between writing a "one" and writing a "zero" into the selected memory cell. So, the boundary lines 44 are symmetrically located with respect to the axes. Such symmetry is not likely to exist in physical reality, so that the axes of this Figure would be shifted from their centered positions shown in FIG. 4.

The relationship of the write currents required to write and store a binary one or binary zero into a selected memory cell is illustrated in FIG. 5. Viewing FIG. 5, it is seen that for the exemplary memory cell concerned, the magnetic field levels (again represented by the character "H") are different for writing a binary one versus writing a binary zero. In FIG.

5, it is seen that when the memory cell is in the state represented by the point 46' (having a binary one written and stored in the memory cell) or state 50' (having a binary zero written and stored in the memory cell), when a positive magnetic field is applied (H+ to point 46) then a binary one is written and stored in the memory cell. On the other hand, when a negative magnetic field (H– to point 50), then a binary zero is written and stored in the memory cell. The trajectory of the state point of the memory cell as illustrated on FIG. 5 is controlled by the application of the magnetic field along the curves labeled 48 to 52 with the stored memory states indicated at the H=0 axis as a binary one (point 46') or a binary zero (point 50'). FIG. 5 represents the hysteresis loop for the memory cell. Further, the hysteresis loop in FIG. 5 is an asymmetric hysteresis loop (i.e., the distance of the curves 48 and 52 are not the same from the "y" axis). As will be seen, the present invention can accommodate such an asymmetry in MRAM memory cells, which asymmetric condition is most usually the case in physical reality. That is, symmetry in this aspect of an MRAM memory cell is not usual, and this invention can accommodate such asymmetry of MRAM memory cells.

Figure 6:
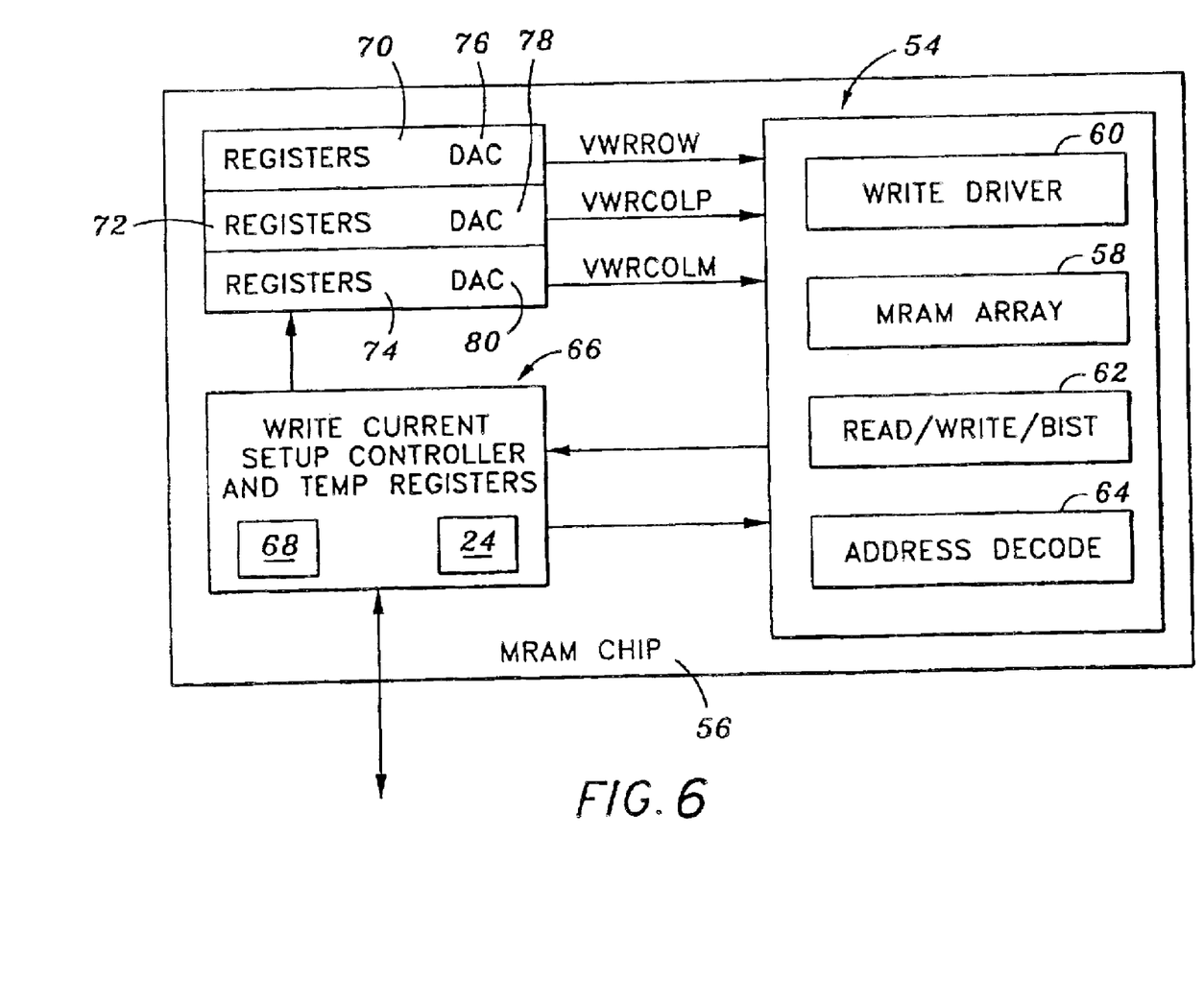
FIG. 6 provides a diagrammatic illustration of a memory chip including a memory cell array, write drivers, a sense amplifier, an address generator, a group of write registers, each with an associated digital to analog converter, and a controller, all on a single chip or substrate.

Turning now to FIG. 6, an exemplary architecture for a memory device 54 embodying the present invention is diagrammatically illustrated. The memory device 54 is most preferable formed on a single substrate (i.e., chip) 56, although the invention is not so limited. Considering the architecture of this memory device 54, it is seen that on the substrate 56 is formed an array 58 of MRAM memory cells (which cells are not individually illustrated in FIG. 6). While the array 58 may include a few cells (i.e., like array 12 and the exemplary array seen in FIG. 3), such is not preferably the case. The array 58 preferably includes a plurality of individual memory cells. That is, the array 58 may include many thousands of millions, or more, of individual MRAM memory cells. Associated with the array 58 of memory cells are write drivers 60, which generate selected current levels for writing data binary bits into the selected memory cells of the array 58. The write drivers 60 provide a variable current level for writing operations, dependent upon the writing needs of the particular array 58. That is, the write current level needed to best and most reliably write data bits into the memory cells of a particular array can vary with design and geometry variables, with process variables, with voltage level changes, and to a lesser degree with operating temperature of the array 58. Moreover, the write current level and the half select current levels for the array 58 can vary dependent on factors that are fixed during the life of the array, and also to a lesser degree on factors that are variable during this life for the array 58.

Accordingly, associated with the write drivers 60 and with MRAM cell array 58, is a Read/Write/BIST (i.e., built in self test) facility 62. The facility 62 includes sense amplifiers used to determine by an iterative process including plural writing operations and plural reading operations performed on a selected memory cell (or cells) of the array 58 that the effective write current being employed at a particular time is effective to reliably write binary data bits into the array 58, and is not so high that the half select current level is exceeded.

An address decoder 64 provides for routing of writing currents, and of reading voltages, to the selected conductive traces 16, 18 (recalling FIGS. 1 and 3) crossing the array 58. By this expedient, a selected memory cell in array 58 is accessed for calibrating the write operation. As will be seen, the selected memory cell of array 58 is accessed in order to determine by an iterative process, the appropriate writing current level to use for the particular array 58 under prevailing conditions.

Further considering FIG. 6, it is seen that the device 54 includes a controller 66, which administers and controls all of the functions of this device, and serves as the I/O (input/output) portal of the device. As will be seen, the controller 66 includes the write circuit 24 referenced earlier, and also includes a combination setup controller and a set of temporary registers (both generally referenced with arrowed numeral 68 on FIG. 6). The functionality of the controller 66 utilized for set up (i.e., combination 68) has communication (as is indicated by arrowed connections on FIG. 6) with a trio of registers 70, 72, and 74, each associated with a respective digital to analog converter (DAC) 76, 78, and 80 and each respectively outputting write current levels indicated with the characters "VWRROW" (Voltage Write Row), "VWRCOLP" (Voltage Write Column Positive), and "VWRCOLM" (Voltage Write Column Minus (i.e., "zero")). The DAC's 76–80 are each capable of providing the maximum required write current level, and the registers 70–74 each store the digital values of the write currents as input data to the DAC's. Importantly, while the presently described embodiment illustrates only a single register and DAC for each of the indicated values, the scope of the invention admits of using plural sets of such registers and DAC's (as is further referred to below) in order to conduct a "multi-plane" operation of the device 54 during set up of this device, or to conduct special writing operations. Importantly, the setup controller and registers include a state machine for effecting a set algorithm (to be further explained below) and for storing intermediate results and test results of the algorithm's interaction with the array 58 during set up of the device 54. Further, the setup controller and temporary registers 68 can be utilized to provide write currents via the DAC's 76–80 to selected ones of the memory cells of the array 58, as will be further explained below.

Having considered the architecture of the memory device 54, attention may now be given to its operation and the algorithm effected during initial set up of the device 54. Importantly, this initial set up may take place each time the device 54 is powered up (i.e., each time the device is turned on), or the initial set up may be a "one time only" event, effected the first time ever that the device 54 is started up, and effecting calibration values for writing data bits into the array 58 which apply for the life of the device 54. As was mentioned above, the design, geometry, fabrication and process variables which affect the required writing current levels for the device 54 are constant throughout its life. Accordingly, a viable methodology for the device is to set it up only once, when it is first powered up. However, operating voltage variations and temperature variations, among other factors, can affect the most desirable writing current level to be used for the MRAM memory cells of the array 58. Thus, as an alternative, the device 54 may be calibrated for the best writing current to be used both when it is first powered up, and when variations in its operating conditions indicate that a recalibration is desirable. Still another alternative is to start up the device 54 using the last effective set of calibration values for writing into the array 54, and to allow the device to operate with these values until operation of the algorithm indicates that a new calibration is needed.

Figure 7:
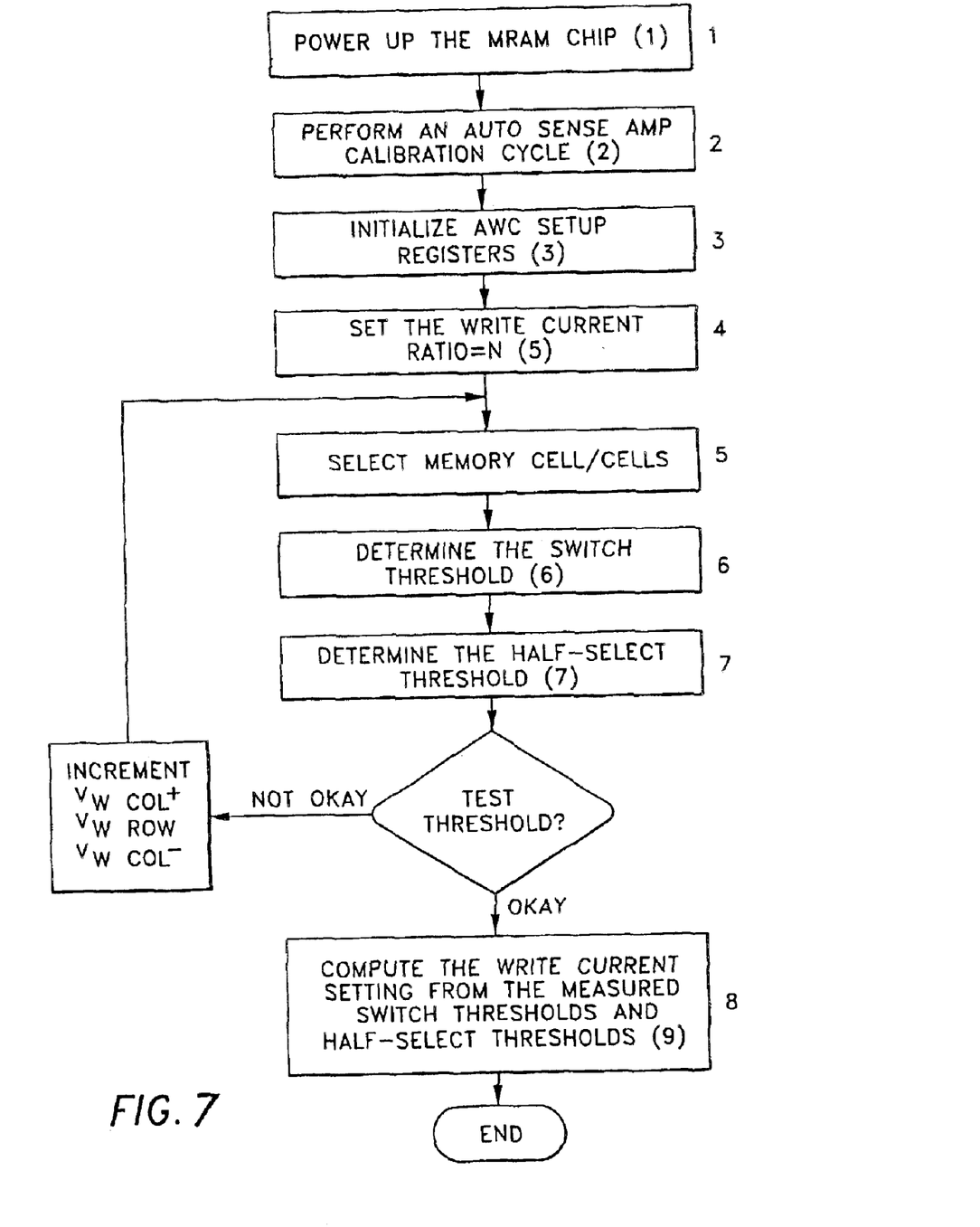
FIG. 7 is a method flow chart illustrating in a broad sense a method of writing to a MRAM memory cell array, while contemporaneously testing for proper writing current level.

Considering now FIG. 7, a sample of the algorithm in broad terms is set out. This sample algorithm is predicated upon a write current calibration being conducted upon initial power up of the device, although the invention is not so limited, as has been pointed out. As is seen in FIG. 7, the first step (step #1) in this process is the applying of power to the device 54. Next, (FIG. 7, step #2) the Read/Write/BIST facility is calibrated so that the reading portion of this facility can reliably and correctly read data values from the memory cells of the array 54. This calibration of the reading (i.e., sensing) amplifiers of the facility 62 of the device 54 in order to correctly read the resistance values of selected memory cells of the array 58 to determine whether they store a binary zero or a binary one is within the skill of the art, and accordingly is not detailed here.

Subsequently, (FIG. 7, step #3) the set up controller and temporary registers 68 are initialized. The state machine of the set up controller will select addresses for memory cells, perform switch threshold and half select threshold tests, store the intermediate and final results in the temporary registers of the combination 68, and these values are then stored for use (either for the life of the device 54, or until the device is next powered up, or until another write current calibration is called for) in the registers 70–74.

The step of performing switch threshold and half select threshold tests involves several sub-steps in an iterative process. First, a write current ratio (N) may be selected or specified (FIG. 7, step #4). For an example, the write current ratio "N" may be selected as equal to or greater than "1." This means that VWRCOLM and VWRCOLP (i.e., write currents for writing "1," and for writing "zero") are equal. Further, VWRROW equals N multiplied by VWRCOLP. These starting values are subject to alteration depending on whether a data "1" or data "0" is to be written, as is further described below.

Figure 8:
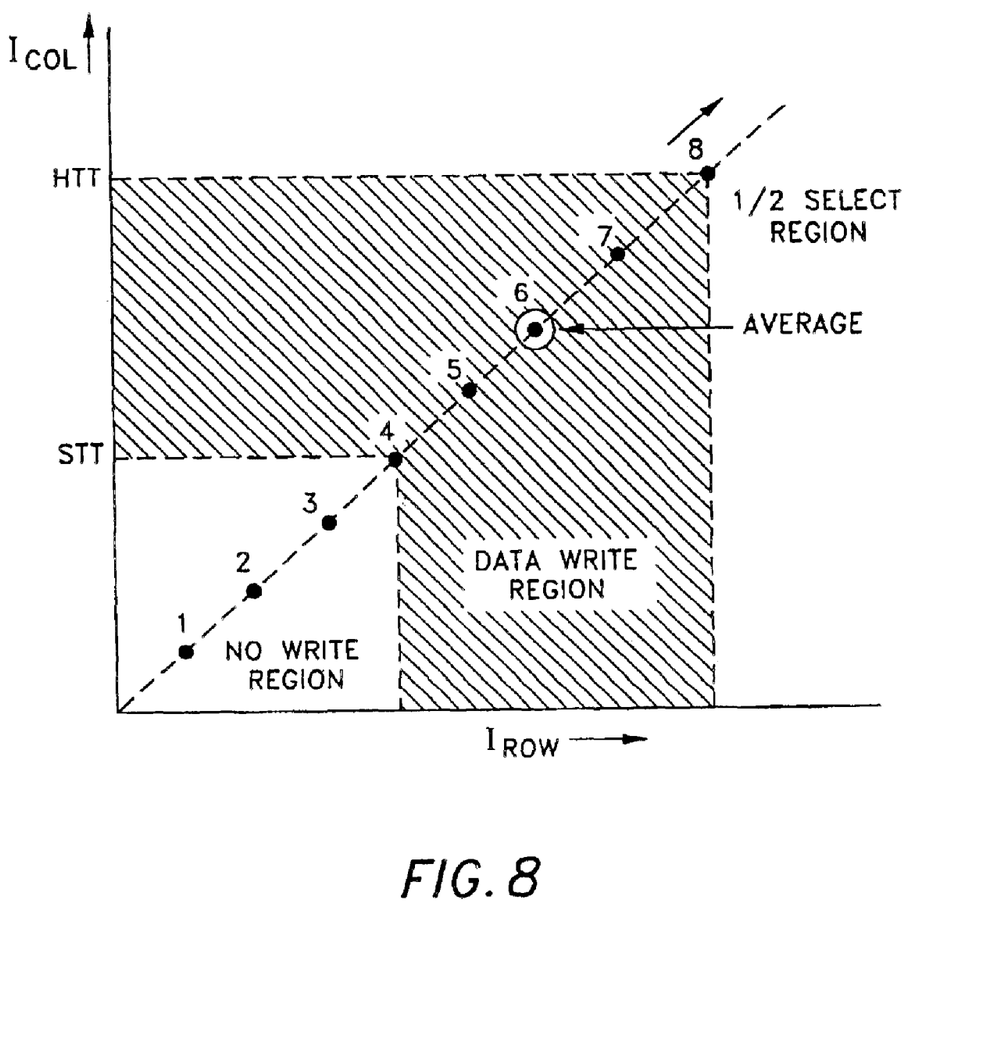
FIG. 8 is a graphical representation of the methodology carried out by the method of FIG. 7 as applied to an exemplary MRAM cell.

With these starting values, a switch threshold test sequence "STTSeq" (an iteration) is conducted. STTSeq will step the write current power supplies of the write drivers 60 successively from a low value (i.e., within the "no change" region of FIG. 4) to a higher value (i.e., a write current outside of lines 44, and certainly in the "write 1, and "write 0", regions of FIG. 4). Considering now FIG. 8, in a particular iteration, the initial low values of write current (the first three levels in this example) are all seen to fall within the "no write" region. At each step increase of the write current level, multiple write operations are performed into selected memory cells of the array 58, and the results are tested using the just-calibrated sense amplifiers of the Read/Write/BIST facility 62. As can be understood by consideration of FIG. 4, at low write current levels, the write operation will fail, and calibration data written into the cells will all be invalid when tested. Thus, the write current levels are iteratively increased, and the test is repeated. As FIG. 8 shows, at some level of write current, as this write current is progressively increased in a step-wise manner of an iteration, the demarcation between the "no write" and the "write" region of FIG. 4 will be reached (i.e., at iteration #4 of FIG. 8). At this write current level, some memory cells of the array 58 will record the calibration test data, and other cells will not. This is a transitional current level between a "no write" result, and a "write" result. This transition is indicated on the method flow chart of FIG. 7 as step #6. The write current level to be used during operation of the device 54 must be higher than this first transitional write current level.

Next, as FIG. 8 shows, the writer current level is further incremented step-wise within the "write" region (i.e., outside of the lines 44 of FIG. 4) so that test iterations 5, 6, etc. illustrated on FIG. 8 all result in the calibration test data being correctly written into and read from the selected cells of the array 54. But, as the graph of FIG. 8 shows, if the write current level is successively increased to a sufficiently high level, then half selected cells will have data errors induced. This effect is seen at test #8 of FIG. 8. At a write current level above that indicated by test #8 of this Figure, some half selected memory cells have data losses or errors. Again, this is a transitional region. See the step #7 of FIG. 7. Thus, when the threshold from the "data write" to the "half-select" region of FIG. 8 is crossed, test calibration data errors are detected because of undesired data changes in half-selected cells. Testing for half-select data errors may be carried out in a number of different ways. One method involves writing calibration data into selected memory cells, and then exposing those same memory cells to half-select currents of the particular level of the iteration process, and testing those cells for data loss or alteration. Another method involves writing calibration data into selected memory cells, after previously writing calibration data into other memory cells which are at half selected memory locations. That is, the addresses of selected memory cells are selected so that some of the cells selected for this calibration iterative process are in half selected locations with respect to other selected memory cells. The cells in the half selected locations have calibration test data written into them, and then the state machine writes calibration test data into the other selected memory cells. By reading successive groups of previously written to and then half-selected cells, and comparing the written calibration data to the sensed data to detect half-select errors, the transition from the "write data" region to the "half-select" (i.e., error inducing) region will be detected.

That is, so long as the effective write current is within the "write data" region of FIG. 8, and is not in the "half select error" region, then the data read from the half selected cells will be valid. But, the iteration process includes writing of calibration data into these half selected memory cells in anticipation of detecting errors in the data of these cells, as is further explained. Next, the half-selected memory cells are read (i.e., using facility 62) and the result of this reading is compared to the written calibration test data to see if the write current level has exceeded the level seen in FIG. 8 at test #8, and the half select error region has been entered.

By this iteration process, the write current level at or indicating the change from the "no write" region into the "write" region (test #4 of FIG. 8) is recorded, and subsequently, the write current level at or indicating the change from the "write" region into the "half select error" region (test #8 of FIG. 8) is also recorded. Most preferably, the write current to be used thereafter for the array is based on these values, or is intermediate of the values for test #4 and test #8, and most preferably, is the average of the current levels for test #4 and test #8 of FIG. 8. That is, the current level of test #6 on FIG. 8 happens to fall at the average of test #4 and test #8, so this is the preferred write current level to be used for the array 54. It will be understood that the average value may not fall at a value previously used for a write current level during the progressive iterative testing process. Nevertheless, an average write current determined from the transition between "no write" and "write data", and from the transition between "write data" and "half-select error" is preferred. This iteration may be carried out for each of the "write one" and "write zero" operations, as is suggested by the "increment" step of FIG. 8. That is, the incrementing of VWRCOLP, and of VWRCOLM (and of VWRROW) may be carried out separately in different iterations as explained above, so that asymmetries in the write current needed for a particular array (recalling the description of FIGS. 4 and 5 above) are accommodated, and optimized write currents are determined both for writing a binary one and for writing a binary zero into selected memory cells of the array.

Now further, it is to be noted that the writing and subsequent reading operations of this iteration process conducted at many selected memory cells of the array 54 are each themselves actually carried out as a sub-iterative process. That is, most preferably, this iterative writing and reading process may utilize a process of writing a first value and reading that value, writing the complementary value and reading that value, and then writing the first value once again and reading that value. This iteration is referred to as a triple write, triple read process. Any number of write/read/verify methodologies may be used to confirm that the data written into and subsequently read from the selected memory cells is carried out successfully. However, after each iteration in the "no write" region, and after each iteration in the "data write" region of FIGS. 4 and 8, the write current level is incremented. Consequently, the switch threshold current level (FIG. 7, step #6) and the half select threshold (FIG. 7, step #7) are determined. And this determination may be made for each of writing a binary one, and for writing a binary zero, so that asymmetries in the current levels required are determined and accommodated. The preferred write current level is determined by the average of the switch threshold current level and the half select threshold current level. During the iteration process, these values are stored temporarily in the registers of the combination 68.

Importantly, as was noted by consideration of FIG. 5, and as has been alluded to above, an alternative for this calibration process includes accommodation of the likely situation in which the write current necessary to write a binary "1" may be (and likely will be) different than that current level necessary to write a binary "0." Thus, in order to determine optimum writing current levels for both a writing of a binary "1" and for a binary "0" in to the cells of the memory array 58, the above outlined iteration process may be carried out for both data levels of "1" and of "0." And, during the iteration process, at each step increase in the write current levels, the values of the selected ones of VWRROW, VWRCOLP, and/or VWRCOLM are incremented as necessary in order to provide a reliable writing operation, and to safeguard data written into half selected memory cells. Moreover, according to the present invention, VWRCOLP and VWRCOLM are not necessarily the same, are not likely to be the same (recalling FIG. 5), and separate loops of the iteration are carried out dependent upon whether a binary "1" or binary "0" is written. According to this alternative then, a different value of write current level will be determined for writing a binary "1" and for writing a binary "0" into the cells of the array 54.

Moreover, at the completion of this iteration process, the writing current to be used for writing a binary "1" and for writing a binary "0" are determined, and these values (whether the same or different in view of asymmetries as explained above) as well as the value for VWRROW, are transferred from the temporary registers of the combination 68 and into the respective registers 70–74 of the device 54. Thereafter, when data is to be written into the cells of the array 58, the values stored in the registers 70–74 are used to determine the current levels for these writing operations.

Another alternative for this invention involves the use of multiple passes (or multiple iterations) of the above process with each iteration producing results associated with the particular MRAM array 58. The iterations are carried out using differing combinations of the memory cells of the array 58. With many such iterations, the results are combined, and provide an "average of averages" type of solution which may better represent the variations among memory cells over a large array having a great plurality of such memory cells.

Still another alternative for this invention involves the use of plural iterations carried out simultaneously on differing parts of a large (or multi-tiered) array of memory cells. The simultaneous operation of several calibration iterations allows the iteration(s) for a large array of memory cells to be carried out in a shorter time, and may yield results more representative of the variations that may be present in a large array of plural memory cells (or of plural tiers or planes) of such memory cells.

Accordingly, and in view of the above, those ordinarily skilled in the pertinent arts will understand that the invention is subject to modification and change in accord with the spirit and scope of the description and disclosure above. Although reference is made to a particularly preferred embodiment of the invention, such reference does not imply a limitation on the invention, and no such limitation is to be inferred. Further, the invention is not limited to the specific embodiments described and illustrated above. Instead, the invention is to be construed according to the claims that follow, which provide a definition of the invention.

What is claimed is:

1. A method of setting up a write current to be utilized in a magnetoresistive random access memory (MRAM) cell array device; said MRAM device including an array of plural memory cells, and a grid of plural conductive traces including a first array of parallel conductive traces extending in a first direction across the array of plural memory cells, and a second array of conductive traces extending in a second direction substantially perpendicular to said first direction across the array of plural memory cells, so that conductive traces of said first array and of said second array of traces intersect at particular memory cells of said array of memory cells, said device including a variable-calibration write current circuit capable of being selectively connected to a selected one of said plurality of memory cells by the particular conductive traces crossing at that selected memory cell to respectively write to and store in said selected memory cell a binary data value according to the direction of magnetization of a free magnet layer of the selected memory cell; said method including steps of:

calibrating the write current circuit in a first iteration by;
a) attempting to write a calibration data value to a selected memory cell utilizing an initial write current;
b) sensing whether the calibration data value is successfully written to the selected memory cell;
c) incrementing the write current, and
d) repeating steps (a) through (c) until the calibration data is successfully written into the selected memory cell, and noting this first write current; and
in a second iteration:
e) further incrementing the write current;
f) writing a calibration data value to a selected memory cell;
g) applying the write current to a selected conductive trace;
h) sensing a calibration data value written to a selected memory cell across which extends the selected conductive trace of step (g)
i) repeating steps (e) through (h) until an error of calibration data is noted on step (h), and noting this second write current;
determining an optimized write current based on the first and the second write currents.

2. The method of claim 1 further including the step of utilizing an average of the first and the second write currents for the optimized write current.

3. The method of claim 1 further including the steps of: sub-dividing said array of memory cells in to sub-arrays, and carrying out the first and the second iterative processes on each sub-array of memory cells in order to determine a plurality of optimized write currents, one for each sub-array of memory cells.

4. The method of claim 3 further including the step of determining an average of said plurality of optimized write currents, and utilizing this average of optimized write current to write data to said array of memory cells.

5. The method of claim 3 including the step of carrying out said iterative processes on said sub-divided memory array simultaneously in order to determine said plurality of optimized write currents.

6. A magnetoresistive random access memory (MRAM) device, said device comprising:
an array of plural MRAM cells, each of said plural MRAM cells including a pair of magnetic layers one of which is fixed in magnetic orientation and the other of which is variable in magnetic orientation; a resistive layer interposed between said pair of magnetic layers, plural pairs of conductive traces extending across said array, each pair of conductive traces including a trace extending in a first direction and another trace extending in a second direction substantially perpendicular to said first direction, at each MRAM cell each trace of a respective pair of conductive traces making electrical contact with a respective one of said pair of magnetic layers, so that each of said plural MRAM cells has a characteristic resistance varying in dependence upon the relative magnetic orientation of said other magnetic layer;
a variable write current driver for providing writing current to a selected one of said plural cells via the respective pair of conductive traces to select a direction of magnetic orientation for said other magnetic layer; and
a write current setup controller for executing a set algorithm to determine whether a calibration is needed, and the write current setup controller determining a write current necessary to effect a selected direction of magnetic orientation for said other magnetic layer.

7. The MRAM cell array of claim 6, further including a variable-calibration sense amplifier capable of association with a selected one of said plural MRAM cells via said conductive traces to sense the resistance of said selected one of said cells.

8. A magnetoresistive random access memory (MRAM) device said device, comprising:
an array of plural MRAM cells, each of said plural MRAM cells including a pair of magnetic layers one of which is fixed in magnetic orientation and the other of which is variable in magnetic orientation; a resistive layer interposed between said pair of magnetic layers, plural pairs of conductive traces extending across said array, each pair of conductive traces including a trace extending in a first direction and another trace extending in a second direction substantially perpendicular to said first direction, at each MRAM cell each trace of a respective pair of conductive traces making electrical contact with a respective one of said pair of magnetic layers, so that each of said plural MRAM cells has a characteristic resistance varying in dependence upon the relative magnetic orientation of said other magnetic layer;
a variable write current driver for providing writing current to a selected one of said plural cells via the respective pair of conductive traces to select a direction of magnetic orientation for said other magnetic layer;
a write current setup controller for determining a write current necessary to effect a selected direction of magnetic orientation for said other magnetic layer; and wherein said write current set up controller further includes at least a pair of registers respectively for temporarily storing write current values for application to each of: a conductive trace extending in a first selected one of said first and second directions, and conductive trace extending in a second selected one of said first and second directions.

9. A magnetoresistive random access memory (MRAM) device, said device comprising;
an array of plural MRAM cells, each of said plural MRAM cells including a pair of magnetic layers one of which is fixed in magnetic orientation and the other of which is variable in magnetic orientation; a resistive layer interposed between said pair of magnetic layers, plural pairs of conductive traces extending across said array, each pair of conductive traces including a trace extending in a first direction and another trace extending in a second direction substantially perpendicular to said first direction, at each MRAM cell each trace of a respective pair of conductive traces making electrical contact with a respective one of said pair of magnetic layers, so that each of said plural MRAM cells has a characteristic resistance varying in dependence upon the relative magnetic orientation of said other magnetic layer;
a variable write current driver for providing writing current to a selected one of said plural cells via the respective pair of conductive traces to select a direction of magnetic orientation for said other magnetic layer;
a write current setup controller for determining a write current necessary to effect as selected direction of magnetic orientation for said other magnetic layer; and wherein said write current set up controller further includes a register respectively for temporarily storing a write current value for application to one of said conductive traces extending in one of said first and second directions.

10. The MRAM cell array of claim 9, further including a single substrate, said single substrate carrying all of:
said array of plural MRAM cells;
said variable write current driver; and
said write current setup controller with said registers.

* * * * *